US007602252B2

(12) United States Patent
Sakai

(10) Patent No.: US 7,602,252 B2
(45) Date of Patent: Oct. 13, 2009

(54) SIGMA DELTA MODULATOR, FRACTIONAL FREQUENCY SYNTHESIZER AND SIGMA DELTA MODULATING METHOD

(75) Inventor: Hidenori Sakai, Tokyo (JP)

(73) Assignee: Advantest Corporation, Tokyo (JP)

( * ) Notice: Subject to any disclaimer, the term of this patent is extended or adjusted under 35 U.S.C. 154(b) by 76 days.

(21) Appl. No.: 11/851,396

(22) Filed: Sep. 7, 2007

(65) Prior Publication Data

US 2008/0084247 A1    Apr. 10, 2008

(30) Foreign Application Priority Data

Oct. 10, 2006    (JP) ............... 2006-276826

(51) Int. Cl.
*H03L 7/195* (2006.01)
*H03M 3/02* (2006.01)

(52) U.S. Cl. ............... 331/1 A; 341/143; 327/156
(58) Field of Classification Search ............... 331/1 A, 331/16, 18; 341/143; 327/105, 291, 156, 327/157, 159; 375/376, 245, 247, 252
See application file for complete search history.

(56) References Cited

U.S. PATENT DOCUMENTS 5,038,117 A * 8/1991 Miller ............... 331/16

| 6,570,452 | B2 * | 5/2003 | Sridharan | ............... | 331/1 A |
| 6,844,836 | B1 | 1/2005 | Lee | | |
| 6,920,182 | B2 * | 7/2005 | Bolton, Jr. | ............... | 375/247 |

FOREIGN PATENT DOCUMENTS

| JP | 2001-298363 | 10/2001 |
| JP | 2004-260791 | 9/2004 |
| JP | 2005-505162 | 2/2005 |
| WO | WO 03-028218 | 4/2003 |

* cited by examiner

*Primary Examiner*—Robert Pascal
*Assistant Examiner*—Ryan J. Johnson
(74) *Attorney, Agent, or Firm*—Jianq Chyun IP Office

(57) ABSTRACT

There is provided a sigma delta modulator that outputs an output signal obtained by performing sigma delta modulation on an input signal, including: a plurality of accumulators that are serially connected; and an output signal generating section that generates the output signal on the basis of comparison result signals respectively output from the accumulators, in which each of the accumulators integrates values of signals being input and when an integration value is not less than a reference value, outputs the comparison result signal with a predetermined value and subtracts the value of the comparison result signal from the integration value, the value of the input signal is input into a first-stage accumulator, the integration value of the preceding-stage accumulator is input into the other accumulator, and at least one of the accumulators includes a low-pass filter that removes a predetermined high-frequency component in a waveform of the integration value.

7 Claims, 9 Drawing Sheets

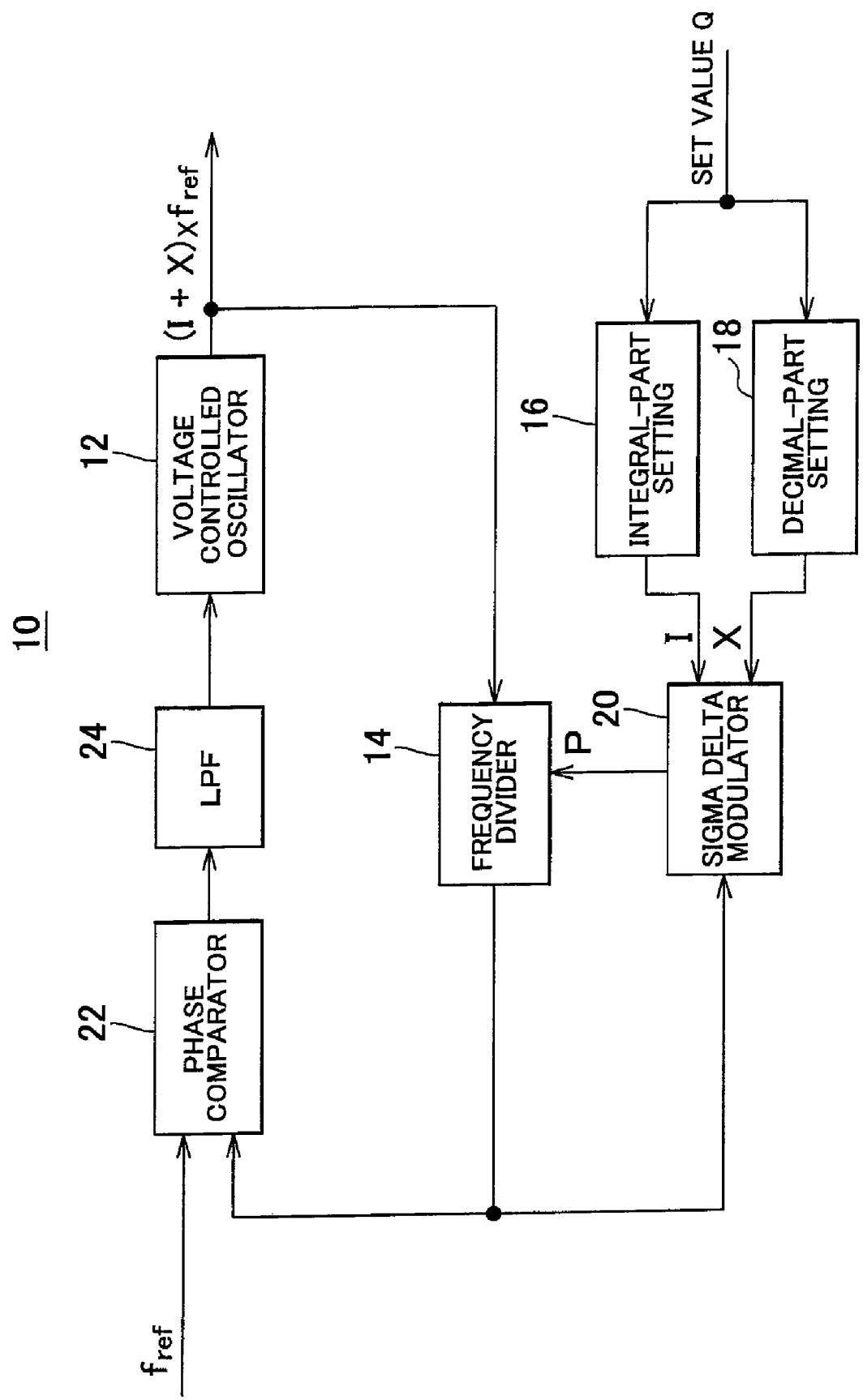
F I G. 1

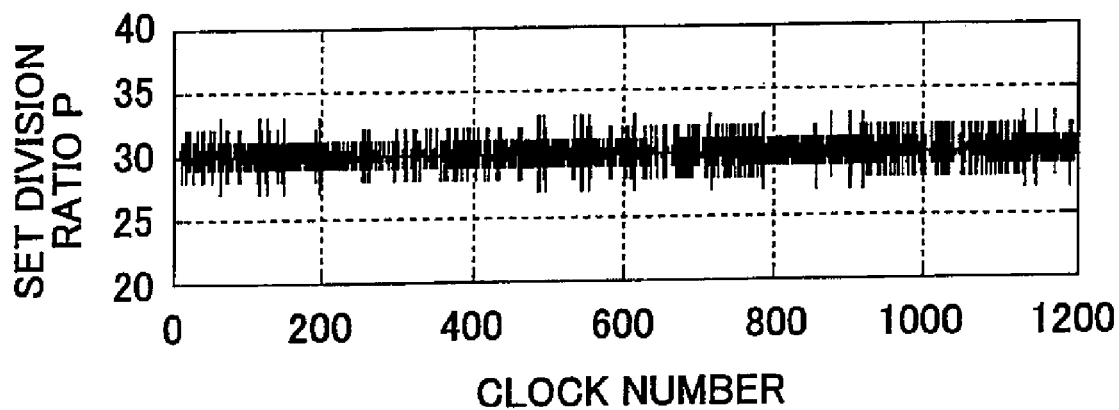
F I G . 5
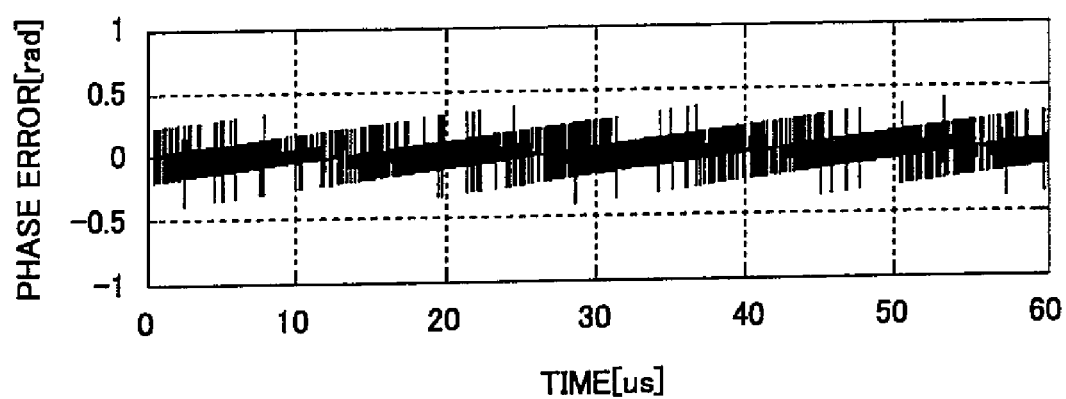
F I G . 6

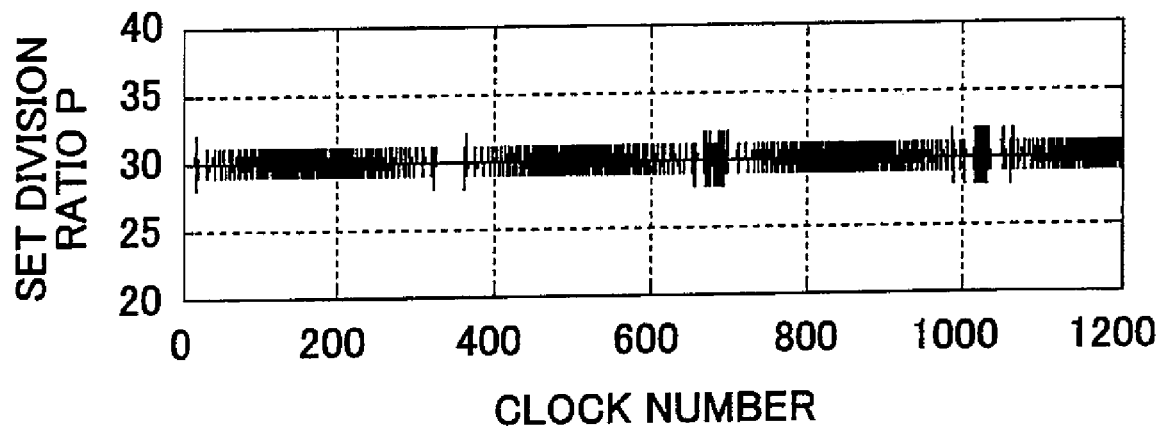
F I G . 7
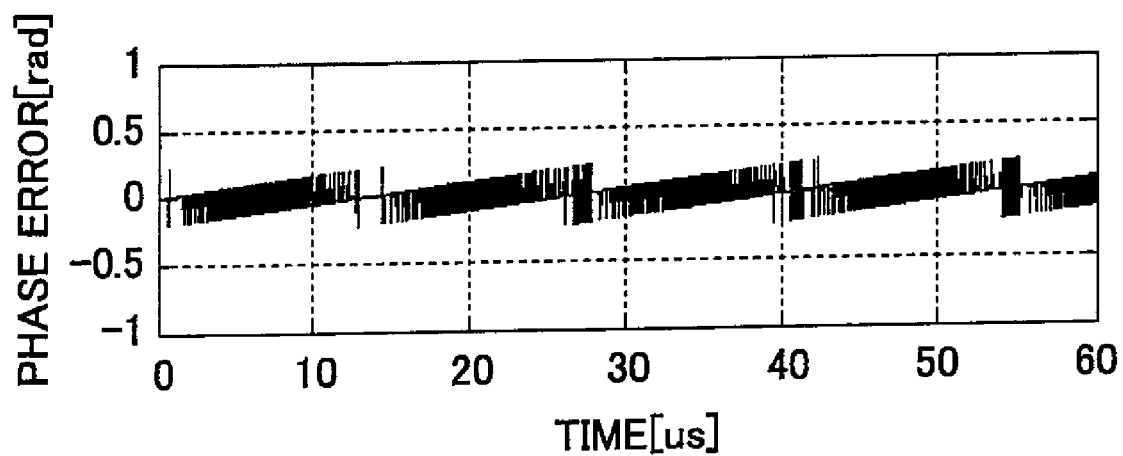
F I G . 8

US 7,602,252 B2

SIGMA DELTA MODULATOR, FRACTIONAL FREQUENCY SYNTHESIZER AND SIGMA DELTA MODULATING METHOD

CROSS REFERENCE TO RELATED APPLICATION

The present application claims priority from a Japanese Patent Application No. 2006-276826 filed on Oct. 10, 2006, the contents of which are incorporated herein by reference.

BACKGROUND

1. Technical Field

The present invention relates to a sigma delta modulator, a fractional frequency synthesizer, and a sigma delta modulating method. More particularly, the present invention relates to a sigma delta modulator, a fractional frequency synthesizer, and a sigma delta modulating method for outputting an output signal obtained by performing sigma delta modulation on an input signal.

2. Related Art

There has been known a frequency synthesizer that includes a voltage controlled oscillator, a frequency divider, a phase comparator, and a low-pass filter and outputs an oscillation signal with a set frequency. Furthermore, there has been known a fractional frequency synthesizer that changes a division ratio of a frequency divider by means of an output signal from a sigma delta modulator having a plurality of accumulators (see Patent Documents 1 to 3, for example). The fractional frequency synthesizer can output an oscillation signal with a frequency that is expressed as a multiple of decimal precision of a reference clock frequency.

[Patent Document 1] Japanese Patent Application Publication 2004-260791

[Patent Document 2] Japanese Patent Application Publication 2001-298363

[Patent Document 3] U.S. Pat. No. 6,844,836 specification

Meanwhile, in the sigma delta modulator, an inclination of a noise shaping characteristic increases, and thus an amplitude of an output signal becomes large when increasing the number of stages of accumulators. Therefore, in the fractional frequency synthesizer using the sigma delta modulator with the accumulators of many stages, a variation region of a division ratio increases, and thus a phase error between a frequency-dividing signal and a reference clock becomes large.

As a result having a growing phase error, the fractional frequency synthesizer including the sigma delta modulator with the accumulators of many stages is influenced by a linearity of a phase comparator, and on the contrary noises in the vicinity of a frequency of an oscillation signal become large.

SUMMARY

Therefore, it is an object of some aspects of the present invention to provide a sigma delta modulator, a fractional frequency synthesizer, and a sigma delta modulating method that can solve the foregoing problems. The above and other objects can be achieved by combinations described in the independent claims. The dependent claims define further advantageous and exemplary combinations of the present invention.

To solve the above problem, according to the first aspect related to the innovations herein, one exemplary sigma delta modulator that outputs an output signal obtained by performing sigma delta modulation on an input signal may include: a plurality of accumulators that are serially connected to one another; and an output signal generating section that generates the output signal on the basis of comparison result signals respectively output from the accumulators, in which each of the accumulators integrates values of signals being input and when an integration value is not less than a reference value, outputs the comparison result signal with a predetermined value and subtracts the value of the comparison result signal from the integration value, the value of the input signal is at least input into the accumulator connected to a predetermined stage, the integration value of the preceding-stage accumulator is input into the other accumulator, and at least one of the accumulators includes a filter that removes a predetermined frequency component in a waveform of the integration value. In this case, the filter may be a low-pass filter that removes a frequency component higher than a predetermined frequency in the waveform of the integration value. Moreover, the accumulator connected to the predetermined stage may be the accumulator connected to a first stage.

According to the second aspect related to the innovations herein, one exemplary fractional frequency synthesizer may include: a voltage controlled oscillator that outputs an oscillation signal with a frequency according to a level of a given control voltage; a frequency divider that divides a frequency of the oscillation signal with a set division ratio; a sigma delta modulator that switches a division ratio in the frequency divider on the basis of an input signal showing a decimal part of the division ratio to be set in the frequency divider; and a phase comparator that generates the control signal with a level according to a phase difference between the oscillation signal divided by the frequency divider and a given reference signal, in which the sigma delta modulator includes: a plurality of accumulators that are serially connected to one another; and an output signal generating section that generates the output signal on the basis of comparison result signals respectively output from the accumulators, each of the accumulators integrates values of signals being input and when an integration value is not less than a reference value, outputs the comparison result signal with a predetermined value and subtracts the value of the comparison result signal from the integration value, the value of the input signal is at least input into the accumulator connected to a predetermined stage, the integration value of the preceding-stage accumulator is input into the other accumulator, and at least one of the accumulators includes a filter that removes a predetermined frequency component in a waveform of the integration value. In this case, the filter may be a low-pass filter that removes a frequency component higher than a predetermined frequency in the waveform of the integration value. Moreover, the accumulator connected to the predetermined stage may be the accumulator connected to a first stage.

According to the third aspect related to the innovations herein, one exemplary sigma delta modulating method for outputting an output signal obtained by performing sigma delta modulation on an input signal may include: a plurality of accumulation output steps of integrating values of signals being input and when an integration value is not less than a reference value, outputting the comparison result signal with a predetermined value and subtracting the value of the comparison result signal from the integration value; and an output signal generating step of generating the output signal on the basis of each of the comparison result signals, in which each of the plurality of accumulation output steps includes a step of integrating the integration value in the other accumulation output step as the value of the input signal and outputting this integration value to the further other accumulation output step, and the plurality of accumulation output steps are sequentially executed, the value of the input signal is at least input into a predetermined step of the accumulation output steps, and at least one of the accumulation output steps includes a step of removing a predetermined frequency component in a waveform of the integration value. In this case, the step of removing the predetermined frequency may include a step of removing a frequency component higher than the predetermined frequency in the waveform of the integration value. Moreover, the input signal may be input into a first accumulation output step of the plurality of accumulation output steps that are sequentially executed.

The summary does not necessarily describe all necessary features of the present invention. The present invention may also be a sub-combination of the features described above.

BRIEF DESCRIPTION OF THE DRAWINGS

FIG. 1 shows a configuration of a fractional frequency synthesizer 10 according to an embodiment of the present invention.

FIG. 5 shows an example of a set division ratio P of a sigma delta modulator having three-stage accumulators 30 that do not include a low-pass filter 36.

FIG. 6 shows an example of a phase error of a fractional frequency synthesizer including a sigma delta modulator having three-stage accumulators 30 that do not include the low-pass filter 36.

FIG. 7 shows an example of a set division ratio P of the sigma delta modulator 20 having three-stage accumulators 30 of which the final-stage accumulator includes the low-pass filter 36.

FIG. 8 shows an example of a phase error of the fractional frequency synthesizer 10 including the sigma delta modulator 20 having three-stage accumulators 30 of which the final-stage accumulator includes the low-pass filter 36.

DESCRIPTION OF EXEMPLARY EMBODIMENTS

Figure 2:
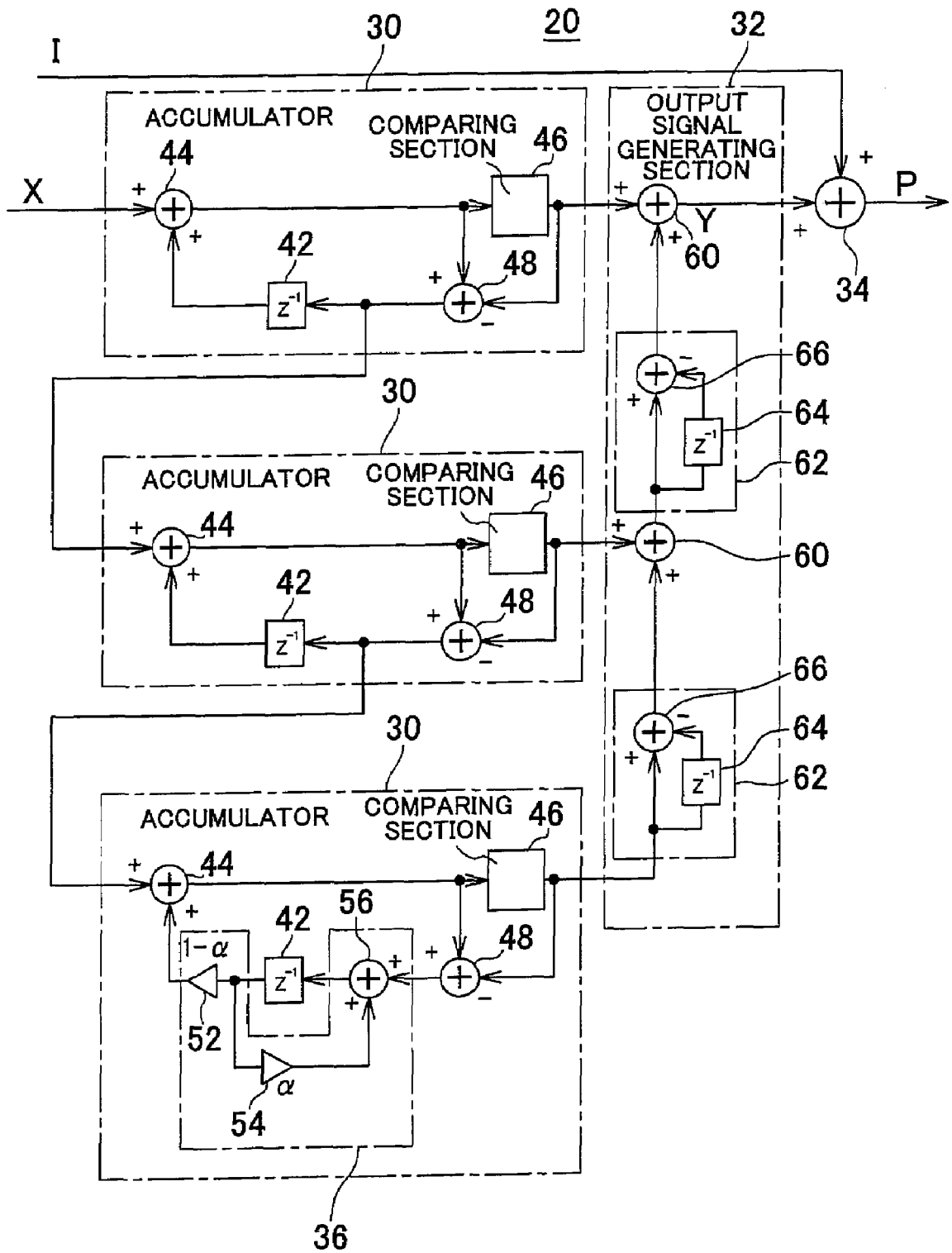
FIG. 2 shows a configuration of a sigma delta modulator 20 according to an embodiment of the present invention.

The embodiments of the invention will now be described based on the preferred embodiments, which do not intend to limit the scope of the present invention, but just exemplify the invention. All of the features and the combinations thereof described in the embodiment are not necessarily essential to the invention.

FIG. 1 shows a configuration of a fractional frequency synthesizer 10 according to the present embodiment. For example, a reference signal with a reference frequency fref output from a reference oscillator is input into the fractional frequency synthesizer 10 and a set value Q expressed with decimal precision is set by a user or an external instrument in the fractional frequency synthesizer 10. Then, the fractional frequency synthesizer 10 outputs an oscillation signal with a frequency which is obtained by multiplying the reference frequency fref by the set value Q.

The fractional frequency synthesizer 10 includes a voltage controlled oscillator 12, a frequency divider 14, an integral-part setting section 16, a decimal-part setting section 18, a sigma delta modulator 20, a phase comparator 22, and an LPF 24. The voltage controlled oscillator 12 inputs a control voltage. Then, the voltage controlled oscillator 12 outputs an oscillation signal with a frequency according to a level of the given control voltage. The frequency divider 14 receives the oscillation signal output from the voltage controlled oscillator 12, and divides a frequency of this oscillation signal with a set division ratio P.

The integral-part setting section 16 extracts and stores an integral part of the set value Q. Then, the integral-part setting section 16 outputs the extracted integral part to the sigma delta modulator 20 as an input signal I that shows an integral part of a division ratio to be set in the frequency divider 14. The decimal-part setting section 18 extracts and stores a decimal part of the set value Q. Then, the decimal-part setting section 18 outputs the extracted decimal part to the sigma delta modulator 20 as an input signal X that shows a decimal part of the division ratio to be set in the frequency divider 14.

The sigma delta modulator 20 switches the division ratio of the frequency divider 14 on the basis of the input signals I and X that respectively show the integral part and the decimal part of the division ratio to be set in the frequency divider 14. More in detail, the sigma delta modulator 20 generates an output signal expressed as an integer value by performing sigma delta modulation on the input signal X showing the decimal part of the division ratio. The sigma delta modulator 20 further generates a set division ratio P by adding the sigma-delta-modulated output signal and the input signal I showing the integral part of the division ratio. Then, the sigma delta modulator 20 switches the division ratio of the frequency divider 14 in accordance with the set division ratio P.

The phase comparator 22 generates a control signal with a level according to a phase difference between the oscillation signal divided by the frequency divider 14 and the given reference signal. In other words, the phase comparator 22 computes a phase error between a frequency-dividing signal obtained by dividing the oscillation signal by the set division ratio P and the reference signal, and outputs the control signal with the level according to the computed phase error. The LPF 24 low-pass filters the control signal output from the phase comparator 22 with a predetermined time constant and, outputs the control signal of which high pass has been removed to the voltage controlled oscillator 12. In other words, the LPF 24 outputs the control signal according to an averaged phase error to the voltage controlled oscillator 12.

Such the fractional frequency synthesizer 10 switches the division ratio of the frequency divider 14 by means of the set division ratio P obtained by performing sigma delta modulation on the set value Q expressed with decimal precision. Therefore, the fractional frequency synthesizer 10 can output an oscillation signal with a frequency expressed as a multiple of decimal precision of the reference frequency fref.

FIG. 2 shows a configuration of the sigma delta modulator 20 according to the present embodiment. The sigma delta modulator 20 outputs an output signal which is obtained by performing sigma delta modulation on an input signal. The sigma delta modulator 20 receives an input signal X showing a decimal part of a division ratio to be set in the frequency divider 14 and an input signal I showing an integral part of the division ratio to be set in the frequency divider 14, and outputs a set division ratio P which is obtained by performing sigma delta modulation on the input signals X and I.

The sigma delta modulator 20 has a plurality of accumulators 30, an output signal generating section 32, and an integral part adder 34. The plurality of accumulators 30 are serially connected to one another. As an example, FIG. 2 shows the sigma delta modulator 20 having three accumulators 30. As another example, the sigma delta modulator 20 in the present embodiment may have two accumulators 30 or four or more accumulators 30. Each of the accumulators 30 integrates signal values that are input, and outputs a comparison result signal with a predetermined value and subtracts the value of the comparison result signal from an integration value when the integration value is not less than a reference value.

Moreover, a value of the input signal X showing the decimal part of the division ratio to be set in the frequency divider 14 is input into the first-stage accumulator 30 among the plurality of accumulators 30. Moreover, the integration value of the preceding-stage accumulator 30 is input into each of the other accumulators 30 other than the first-stage accumulator among the plurality of accumulators 30. As an example, when a value integrated in the preceding-stage accumulator 30 is not less than the reference value, the next accumulator 30 may receive an integration value obtained by subtracting the value of the comparison result signal from the integrated value from the preceding-stage accumulator 30. On the contrary, when the value integrated in the preceding-stage accumulator 30 is smaller than the reference value, the next accumulator 30 may receive the integrated value smaller than the reference value from the preceding-stage accumulator 30. As another example, when the preceding-stage accumulator 30 outputs, for example, an overflow signal as a comparison result signal, the next-stage accumulator 30 may receive an overflowed value when the overflow signal is output. In other words, the next-stage accumulator 30 may receive, as an example, an error (a quantization error) between the integrated value and the comparison result signal in the preceding-stage accumulator 30.

As an example, each of the accumulators 30 may receive signals with values of which the size is not less than zero and less than one, and sequentially accumulate the input values every clock to generate an integration value. As another example, each of the accumulators 30 may further output a comparison result signal of which a value is one when an integration value is not less than one, and output a comparison result signal of which a value is zero when the integration value is less than zero. As further another example, when a sequentially-output integration value is not less than one, each of the accumulators 30 may subtract one that is a value of a comparison result signal from the integration value.

As an example of a more concrete configuration, each of the accumulators 30 may include an accumulation register 42, an addition section 44, a comparing section 46, and a subtraction section 48. The accumulation register 42 delays the input value by one clock and outputs the delayed value. As an example, the accumulation register 42 may be supplied with, for example, a frequency-dividing signal output from the frequency divider 14 as a clock. The addition section 44 adds a value according to a value stored on the accumulation register 42 to the value of the signal being input, and outputs its integration value.

The comparing section 46 compares the integration value output from the addition section 44 and the reference value, and outputs a comparison result signal with a predetermined value when the integration value output from the addition section 44 is not less than the reference value. As an example, the comparing section 46 may compare the integration value output from the addition section 44 and one, and output a comparison result signal of which a value is one when the integration value output from the addition section 44 is not less than one and output a comparison result signal of which a value is zero when the integration value output from the addition section 44 is less than one. The subtraction section 48 subtracts the value of the comparison result signal output from the comparing section 46 from the integration value input into the comparing section 46, and stores its result on the accumulation register 42.

A value of the input signal X showing the decimal part of the division ratio to be set in the frequency divider 14 is input into the addition section 44 of the first-stage accumulator 30 in such a configuration. Moreover, an integration value output from the subtraction section 48 in the preceding-stage accumulator 30 is input into the addition section 44 of the next-stage accumulator 30 other than the first-stage accumulator.

The first-stage accumulator 30 of the plurality of accumulators 30 as described above can output the comparison result signal of which the value is expressed as an integer value and is substantially identical with the value of the input signal X when time-averaging the comparison result signal. Furthermore, the accumulators 30 other than the first-stage accumulator output the comparison result signals which are substantially identical with an integration value of a quantization error in the preceding-stage accumulator 30 when time-averaging the comparison result signal. According to this, each of the accumulators 30 other than the first-stage accumulator can output a comparison result signal that becomes a predetermined value (for example, one) in a period according to an accumulated speed of a quantization error in the preceding-stage accumulator 30. Further, since the accumulators 30 other than the first-stage accumulator integrate quantization errors in the preceding-stage accumulators 30 to generate the comparison result signal, the accumulators 30 other than the first-stage accumulator output the comparison result signal in a period not more than the period in which the comparison result signal of the preceding-stage accumulator 30 becomes the reference value (for example, one). Therefore, the accumulator 30 other than the first-stage accumulator can output the comparison result signal having a shorter period in which the comparison result signal becomes the reference value (for example, one) as the accumulator is more subsequent-stage accumulator.

Moreover, at least one of the accumulators 30 includes a low-pass filter 36 that removes a predetermined high-frequency component in a waveform of the integration value. As an example, the final-stage accumulator 30 of the accumulators 30 may have the low-pass filter 36, and the other accumulators 30 may not have the low-pass filter 36. The accumulator 30 including the low-pass filter 36 can slow a response speed of a comparison result signal being output to an accumulated speed of quantization errors generated in the preceding-stage accumulator 30.

As an example of a more concrete configuration, the low-pass filter 36 may include a first multiplication section 52, a second multiplication section 54, and an in-filter addition section 56. The first multiplication section 52 multiplies a first coefficient by the value stored on the accumulation register 42 in the accumulator 30 including the low-pass filter 36, and inputs its result into the addition section 44. The second multiplication section 54 multiplies a second coefficient by the value stored on the accumulation register 42 in the accumulator 30 including the low-pass filter 36, and outputs its result. Here, the second coefficient may be a value a that is more than zero and less than one, and the first coefficient may be a value $(1-\alpha)$ that is obtained by subtracting the second coefficient a from one. For example, it is preferable that the first coefficient and the second coefficient are a stable value that does not cause a signal to oscillate in a loop path including the low-pass filter 36. For example, these coefficients may be 0.5 together, or one side may be 0.75 and the other side may be 0.25.

The in-filter addition section 56 adds the value output from the second multiplication section 54 to the value output from the subtraction section 48 in the accumulator 30 including the low-pass filter 36 and stores its result on the accumulation register 42. The low-pass filter 36 having the above configuration can form a low-pass filter by a primary IIR (Infinite Impulse Response) filter in cooperation with the accumulation register 42.

In addition, the low-pass filter 36 may be a secondary or more IIR filter. Moreover, the low-pass filter 36 may be an FIR (Finite Impulse Response) filter in place of the IIR filter. The low-pass filter 36 may further include a first subtraction section that subtracts a predetermined constant from the value stored on the accumulation register 42 and inputs its result into the addition section 44 and a second subtraction section that subtracts a predetermined constant from the value stored on the accumulation register 42 and inputs its result into the in-filter addition section 56, in place of the first multiplication section 52 and the second multiplication section 54. Furthermore, in the sigma delta modulator 20, the plurality of accumulators 30 may respectively include the low-pass filter 36. In this case, for example, the plurality of accumulators 30 may include the low-pass filter 36 of which a filter configuration is different from one another in accordance with the location of the stage of the accumulator 30.

In addition, in the case of using the same number of accumulators, an inclination of noise shaping to a low-pass frequency component in the IIR filter becomes larger compared to the FIR filter. That is to say, since noises can be removed with the smaller accumulators when removing the low-pass frequency component, it is preferable to use the IIR filter.

The output signal generating section 32 generates the output signal on the basis of the comparison result signals that are respectively output from the accumulators 30. As an example, the output signal generating section 32 may generate the output signal by adding a differential signal, which is obtained by respectively differentiating the comparison result signals output from the accumulators 30 other than the first-stage accumulator, to the comparison result signal output from the first-stage accumulator 30.

In this case, as an example, the output signal generating section 32 may respectively differentiate the comparison result signals output from the accumulators 30 other than the first-stage accumulator by means of more derivations as the corresponding accumulator 30 has a larger stage number. The output signal generating section 32 may respectively differentiate, as an example, the comparison result signals output from the accumulators 30 other than the first-stage accumulator by the number which is obtained by subtracting one from the stage number of the corresponding accumulator 30. In other words, the output signal generating section 32 may generate a one-time differential signal which is obtained by differentiating the comparison result signal once (2−1 time) in association with the second-stage accumulator 30, generate a two-time differential signal which is obtained by differentiating the comparison result signal two times (3−1 times) in association with the third-stage accumulator 30, and generate a three-time differential signal which is obtained by differentiating the comparison result signal three times (3−1 times) in association with the fourth-stage accumulator 30. Then, the output signal generating section 32 may generate an output signal which is obtained by adding the plurality of differential signals to the comparison result signal output from the first-stage accumulator 30.

As an example of a more concrete configuration, the output signal generating section 32 may include in-output-signal-generating-section adders 60 that are respectively provided corresponding to the accumulators 30 other than the final-stage accumulator and differential circuits 62 that are respectively provided corresponding to the accumulators 30 other than the first-stage accumulator. Each of the in-output-signal-generating-section adders 60 outputs an addition signal which is obtained by adding the comparison result signal output from the corresponding accumulator 30 and the differential signal output from the differential circuit 62 corresponding to the next-stage accumulator 30.

The final-stage differential circuit 62 outputs a differential signal which is obtained by differentiating the comparison result signal output from the corresponding final-stage accumulator 30. In other words, the final-stage differential circuit 62 outputs a differential signal showing a change amount of the comparison result signal output from the corresponding final-stage accumulator 30. The differential circuit 62 other than the final-stage differential circuit outputs a differential signal which is obtained by differentiating the addition signal output from the corresponding in-output-signal-generating-section adder 60. In other words, the differential circuit 62 other than the final-stage differential circuit outputs a differential signal that shows a change amount of the addition signal output from the corresponding in-output-signal-generating-section adder 60.

As an example, each of the differential circuits 62 may include an in-differential-circuit register 64 and an in-differential-circuit subtracter 66. The differential circuit 62 delays an input signal by one clock. The in-differential-circuit register 64 subtracts a signal delayed by one clock by the in-differential-circuit register 64 from the input signal. According to this, the differential circuit 62 can differentiate the addition signal output from the corresponding in-output-signal-generating-section adder 60 in the case of a stage other than a final stage and differentiate the comparison result signal output from the corresponding accumulator 30 in the case of the final stage.

Then, the first-stage in-output-signal-generating-section adder 60 outputs the addition signal as an output signal of the output signal generating section 32. According to this, the output signal generating section 32 can respectively differentiate the comparison result signals output from the accumulators 30 by the number of times according to the stage number of the accumulator 30 that outputs the corresponding comparison result signal and add its result to the comparison result signal output from the first-stage accumulator 30.

The integral part adder 34 adds the output signal output from the output signal generating section 32 and the input signal I showing the integral part of the division ratio to be set in the frequency divider 14. Then, the integral part adder 34 outputs an added result to the frequency divider 14 as the set division ratio P.

The sigma delta modulator 20 as described above can output the set division ratio P that is substantially identical with the set value Q of decimal precision set by a user or the like when being averaged. Therefore, the fractional frequency synthesizer 10 including such the sigma delta modulator 20 can output an oscillation signal with a frequency which is obtained by multiplying the reference frequency fref by the set value Q.

Further, the sigma delta modulator 20 adds the differential signal obtained by differentiating the comparison result signals output from the accumulators 30 after the second stage to the output signal. According to this, the sigma delta modulator 20 can increase and decrease the set division ratio P in a period according to an accumulated speed of quantization errors in the accumulators 30 from the first stage to the preceding stage of the final stage. Moreover, the accumulators 30 after the second stage outputs a comparison result signal with a shorter period as the stage number is larger. According to this, the sigma delta modulator 20 can increase and decrease the set division ratio P at higher frequency as the number of the accumulators 30 becomes larger.

Moreover, the output signal generating section 32 further differentiates the comparison result signals output from the accumulators 30 after the second stage by the number of times according to the stage number of the accumulator 30 that outputs the corresponding comparison result signal, and generates its differential signal. According to this, the output signal generating section 32 can increase amplitude of the differential signal which is obtained by differentiating the comparison result signals output from the more subsequent-stage accumulators 30. As described above, the sigma delta modulator 20 can reduce a phase noise in a low-frequency area and show an effect of noise shaping by which the phase noise is moved to a high-frequency area.

Additionally, since at least one (for example, the final-stage accumulator 30) of the accumulators 30 after the second stage has the low-pass filter 36, the sigma delta modulator 20 can slow a response speed of the comparison result signal output from the corresponding accumulator 30. According to this, the sigma delta modulator 20 can reduce the amplitude of the increase and the decrease of the increased set division ratio P (that is, the output signal) due to the influence of the corresponding accumulator 30 (for example, the final-stage accumulator 30) after the second stage Since the fractional frequency synthesizer 10 can restrain the variation of the frequency-dividing signal output from the frequency divider 14 by including the sigma delta modulator 20 in which the amplitude of the set division ratio P is small, the fractional frequency synthesizer 10 can reduce a phase error in the phase comparator 22. As a result, the fractional frequency synthesizer 10 can switch a division ratio by means of high-order sigma delta modulation without reducing a loop band of the LPF 24.

Figure 3:
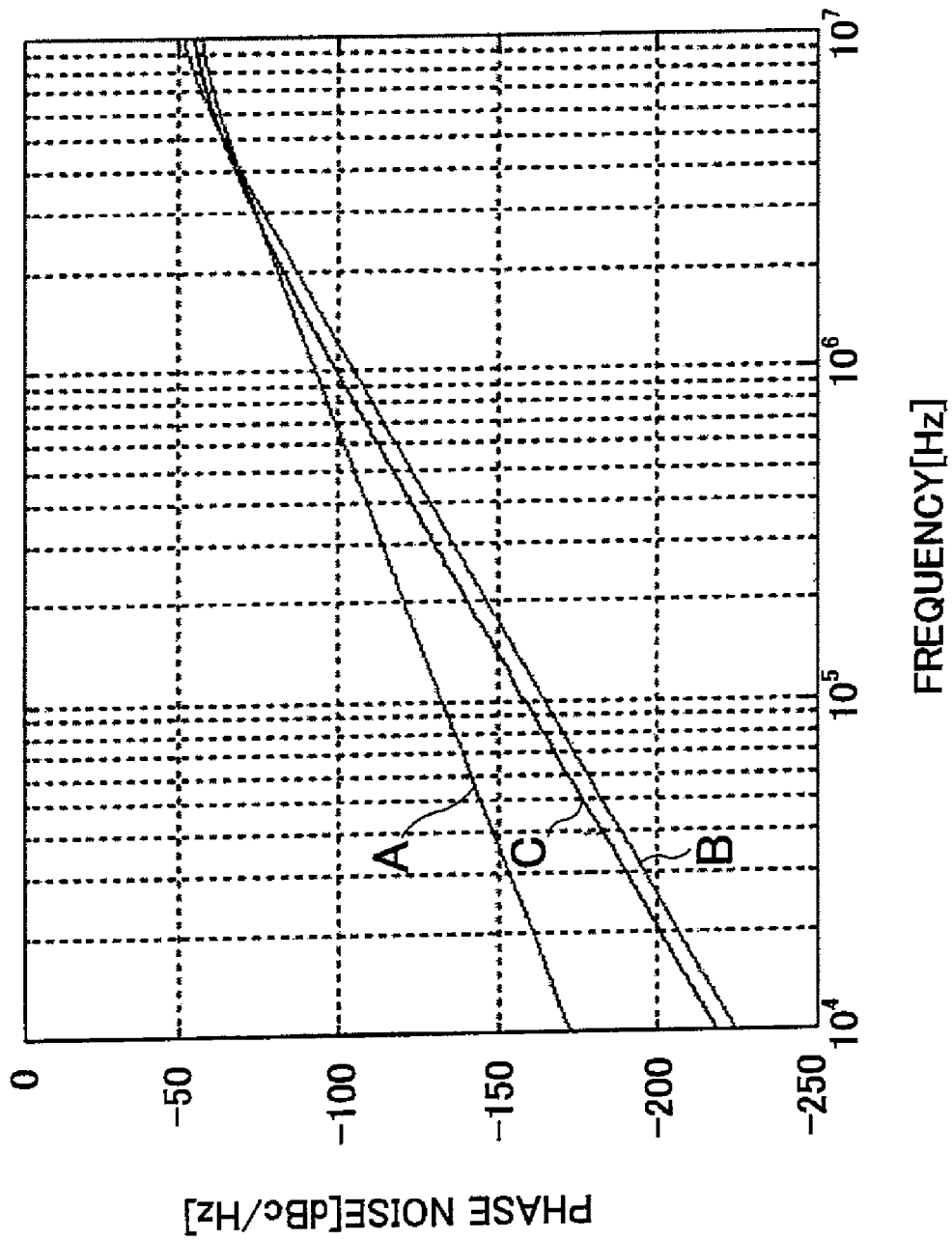
FIG. 3 shows a frequency characteristic for a phase noise which is generated by the sigma delta modulator 20 when assuming that a quantization noise of an accumulator 30 is a white noise.

FIG. 3 shows an example of a frequency characteristic for a phase noise which is generated by the sigma delta modulator 20 when assuming that a quantization noise of the accumulator 30 is a white noise. In addition, in FIG. 3, A shows a characteristic of a sigma delta modulator having the three-stage accumulators 30 of which all do not include the low-pass filter 36, B shows a characteristic of a sigma delta modulator having the four-stage accumulators 30 of which all do not include the low-pass filter 36, and C shows a characteristic of the sigma delta modulator 20 having the four-stage accumulators 30 of which the final-stage accumulator includes the low-pass filter 36.

Here, NTF (Noise Transfer Function) in the sigma delta modulator having the three-stage accumulators 30 of which all do not include the low-pass filter 36 is $(1-Z^{-1})^3$. NTF in the sigma delta modulator having the four-stage accumulators 30 of which all do not include the low-pass filter 36 is $(1-Z^{-1})^4$. Further, NTF in the sigma delta modulator 20 having the four-stage accumulators 30 of which the final-stage accumulator includes the low-pass filter 36 is $(1-Z^{-1})^4/(1-\alpha \times Z^1)$. FIG. 3 shows a frequency characteristic of a phase noise according to such NTF.

When comparing A and C shown in FIG. 3, the sigma delta modulator 20 having the four-stage accumulators 30 of which the final-stage accumulator includes the low-pass filter 36 has a phase noise in a frequency range below 3 MHz smaller than that of the sigma delta modulator having the three-stage accumulators 30 of which all do not include the low-pass filter 36. In other words, in the frequency range below 3 MHz, the sigma delta modulator 20 having the four-stage accumulators 30 of which the final-stage accumulator includes the low-pass filter 36 has a good characteristic.

Moreover, when comparing B and C shown in FIG. 3, the sigma delta modulator 20 having the four-stage accumulators 30 of which the final-stage accumulator includes the low-pass filter 36 has a phase noise in a frequency range above 4 MHz smaller than that of the sigma delta modulator having the four-stage accumulators 30 of which all do not include the low-pass filter 36. In other words, in the frequency range above 4 MHz, the sigma delta modulator 20 having the four-stage accumulators 30 of which the final-stage accumulator includes the low-pass filter 36 has a good characteristic.

Figure 4:
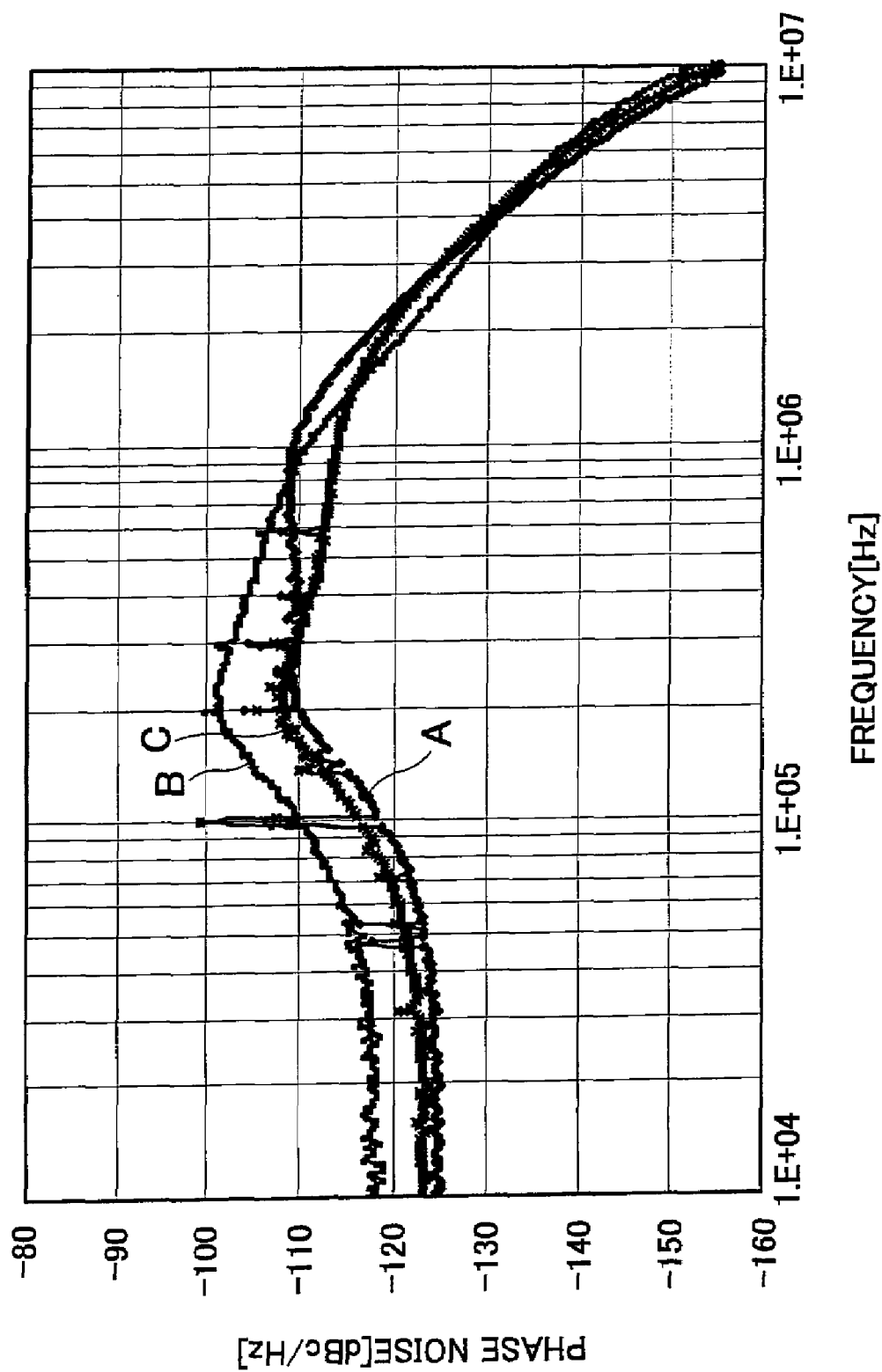
FIG. 4 shows a measurement result of a frequency characteristic of a phase noise included in an oscillation signal output from a voltage controlled oscillator 12.

FIG. 4 shows an example of a measurement result of a frequency characteristic of a phase noise included in an oscillation signal output from the voltage controlled oscillator 12. In addition, A, B, and C shown in FIG. 4 show a characteristic of a fractional frequency synthesizer having a sigma delta modulator similar to that of A, B, and C shown in FIG. 3.

When comparing A, B, and C, the fractional frequency synthesizer including the sigma delta modulator having the three-stage accumulators 30 of which all do not include the low-pass filter 36 has the smallest phase noise in a frequency range below 300 kHz included in a sending signal. The reason is that the amplitude of the set division ratio P of the sigma delta modulator having the three-stage accumulators 30 of which all do not include the low-pass filter 36 is smallest.

On the other hand, the fractional frequency synthesizer 10 including the sigma delta modulator 20 having the four-stage accumulators 30 of which the final-stage accumulator includes the low-pass filter 36 has the smallest phase noise in a frequency range from 300 kHz to 1.5 MHz included in the sending signal. In other words, in the frequency range from 300 kHz to 1.5 MHz, the fractional frequency synthesizer 10 including the sigma delta modulator 20 having the four-stage accumulators 30 of which the final-stage accumulator includes the low-pass filter 36 has a good characteristic. Furthermore, in the case of a phase noise in a frequency range below 300 kHz, the fractional frequency synthesizer 10 including the sigma delta modulator 20 having the four-stage accumulators 30 of which the final-stage accumulator includes the low-pass filter 36 has the phase noise substantially equal to that of the fractional frequency synthesizer including the sigma delta modulator having the three-stage accumulators 30 of which all do not include the low-pass filter 36.

In regard to the characteristic of the sigma delta modulator from 300 kHz to 1.5 MHz, the sigma delta modulator having the four-stage accumulators 30 of which all do not include the low-pass filter 36 has the smallest phase noise as shown in FIG. 3. On the contrary, the fractional frequency synthesizer 10 including the sigma delta modulator 20 having the four-stage accumulators 30 of which the final-stage accumulator includes the low-pass filter 36 has a small phase noise included in an oscillation signal because the amplitude of the set division ratio P is small. As described above, the fractional frequency synthesizer 10 can improve a characteristic so as to reduce a phase noise in the vicinity of a frequency of an oscillation signal.

FIG. 5 shows an example of the set division ratio P of the sigma delta modulator having the three-stage accumulators 30 that do not include the low-pass filter 36. FIG. 6 shows an example of a phase error of the fractional frequency synthesizer including the sigma delta modulator having the three-stage accumulators 30 that do not include the low-pass filter 36. FIG. 7 shows an example of the set division ratio P of the sigma delta modulator 20 having the three-stage accumulators 30 of which the final-stage accumulator includes the low-pass filter 36. FIG. 8 shows an example of a phase error of the fractional frequency synthesizer 10 including the sigma delta modulator 20 having the three-stage accumulators 30 of which the final-stage accumulator includes the low-pass filter 36.

Referring to FIG. 5, the fluctuation amplitude of the set division ratio P output from the sigma delta modulator having the three-stage accumulators 30 that do not include the low-pass filter 36 was 30±3 as an example. Moreover, referring to FIG. 7, the fluctuation amplitude of the set division ratio P of the sigma delta modulator 20 having the three-stage accumulators 30 of which the final-stage accumulator includes the low-pass filter 36 was 30±2 as an example. In this manner, the sigma delta modulator 20 has the small fluctuation amplitude of the set division ratio P.

Moreover, when comparing FIG. 6 and FIG. 8, the fractional frequency synthesizer 10 including the sigma delta modulator 20 having the three-stage accumulators 30 of which the final-stage accumulator includes the low-pass filter 36 has the amplitude of the phase error smaller than that of the fractional frequency synthesizer including the sigma delta modulator having the three-stage accumulators 30 of which all do not include the low-pass filter 36. In this manner, the fractional frequency synthesizer 10 can reduce a phase error.

Figure 9:
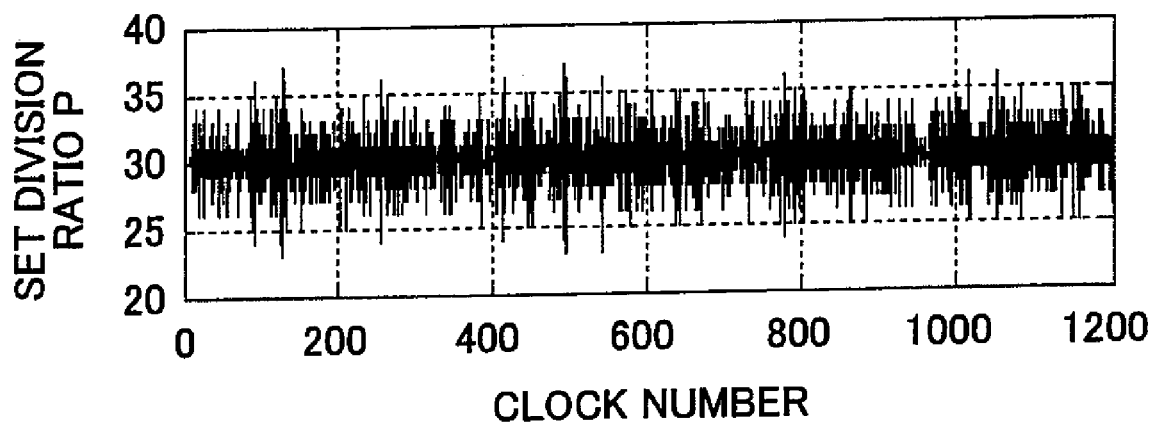
FIG. 9 shows an example of a set division ratio P of a sigma delta modulator having four-stage accumulators 30 that do not include the low-pass filter 36.
Figure 10:
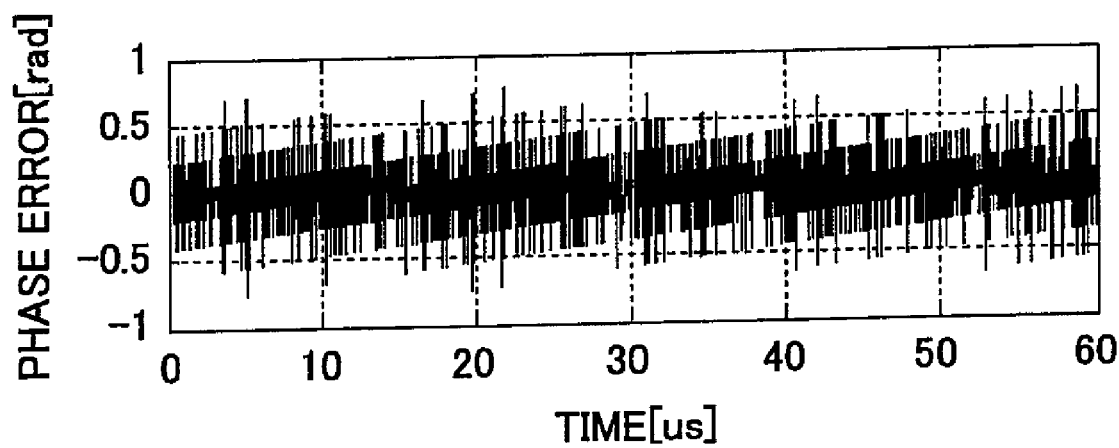
FIG. 10 shows an example of a phase error of a fractional frequency synthesizer including a sigma delta modulator having four-stage accumulators 30 that do not include the low-pass filter 36.
Figure 11:
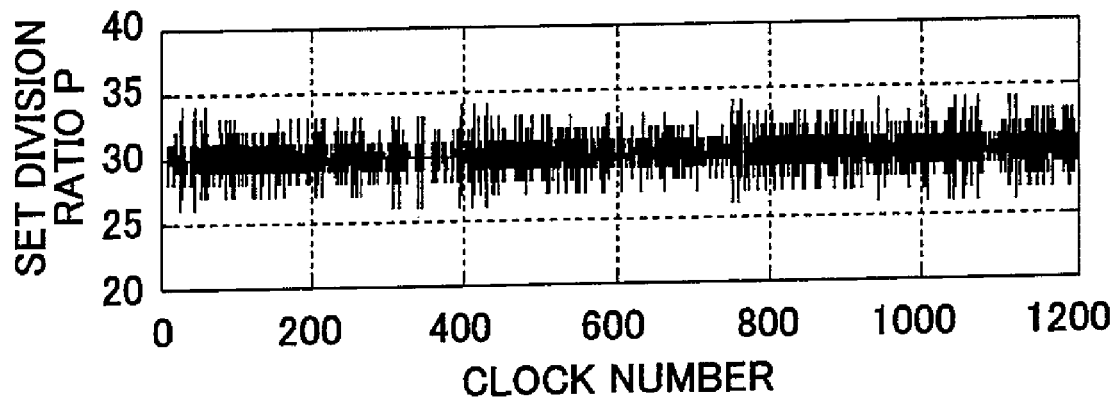
FIG. 11 shows an example of a set division ratio P of the sigma delta modulator 20 having four-stage accumulators 30 of which the final-stage accumulator includes the low-pass filter 36.
Figure 12:
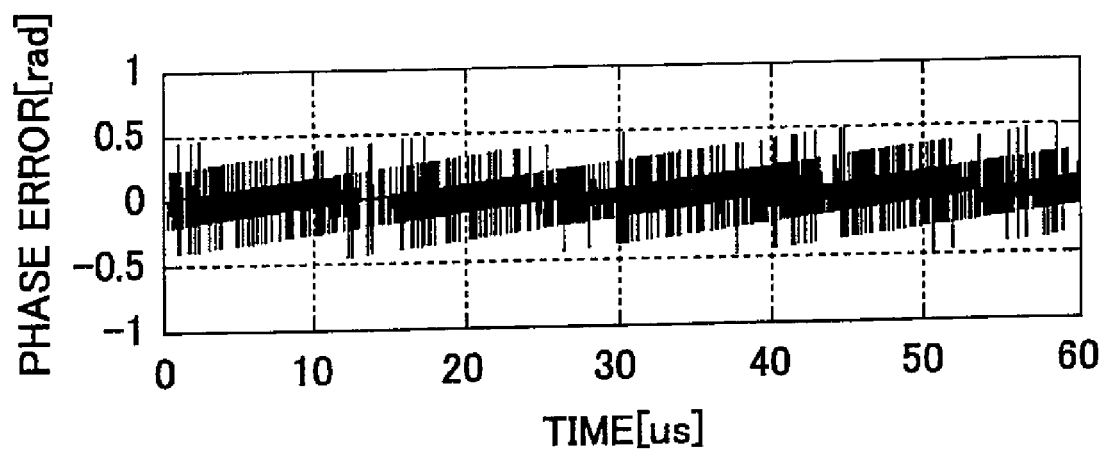
FIG. 12 shows an example of a phase error of the fractional frequency synthesizer 10 including the sigma delta modulator 20 having four-stage accumulators 30 of which the final-stage accumulator includes the low-pass filter 36.

FIG. 9 shows an example of the set division ratio P of the sigma delta modulator having the four-stage accumulators 30 that do not include the low-pass filter 36. FIG. 10 shows an example of a phase error of the fractional frequency synthesizer including the sigma delta modulator having the four-stage accumulators 30 that do not include the low-pass filter 36. FIG. 11 shows an example of the set division ratio P of the sigma delta modulator 20 having the four-stage accumulators 30 of which the final-stage accumulator includes the low-pass filter 36. FIG. 12 shows an example of a phase error of the fractional frequency synthesizer 10 including the sigma delta modulator 20 having the four-stage accumulators 30 of which the final-stage accumulator includes the low-pass filter 36.

Referring to FIG. 9, the fluctuation amplitude of the set division ratio P output from the sigma delta modulator having the four-stage accumulators 30 that do not include the low-pass filter 36 was 30±7 as an example. Moreover, referring to FIG. 11, the fluctuation amplitude of the set division ratio P of the sigma delta modulator 20 having the four-stage accumulators 30 of which the final-stage accumulator includes the low-pass filter 36 was 30±4 as an example. In this manner, the sigma delta modulator 20 can reduce the fluctuation amplitude of the set division ratio P.

Moreover, when comparing FIG. 10 and FIG. 12, the fractional frequency synthesizer 10 including the sigma delta modulator 20 having the four-stage accumulators 30 of which the final-stage accumulator includes the low-pass filter 36 has the amplitude of the phase error smaller than that of the fractional frequency synthesizer including the sigma delta modulator having the four-stage accumulators 30 of which all do not include the low-pass filter 36. In this manner, the fractional frequency synthesizer 10 can reduce a phase error.

Figure 13:
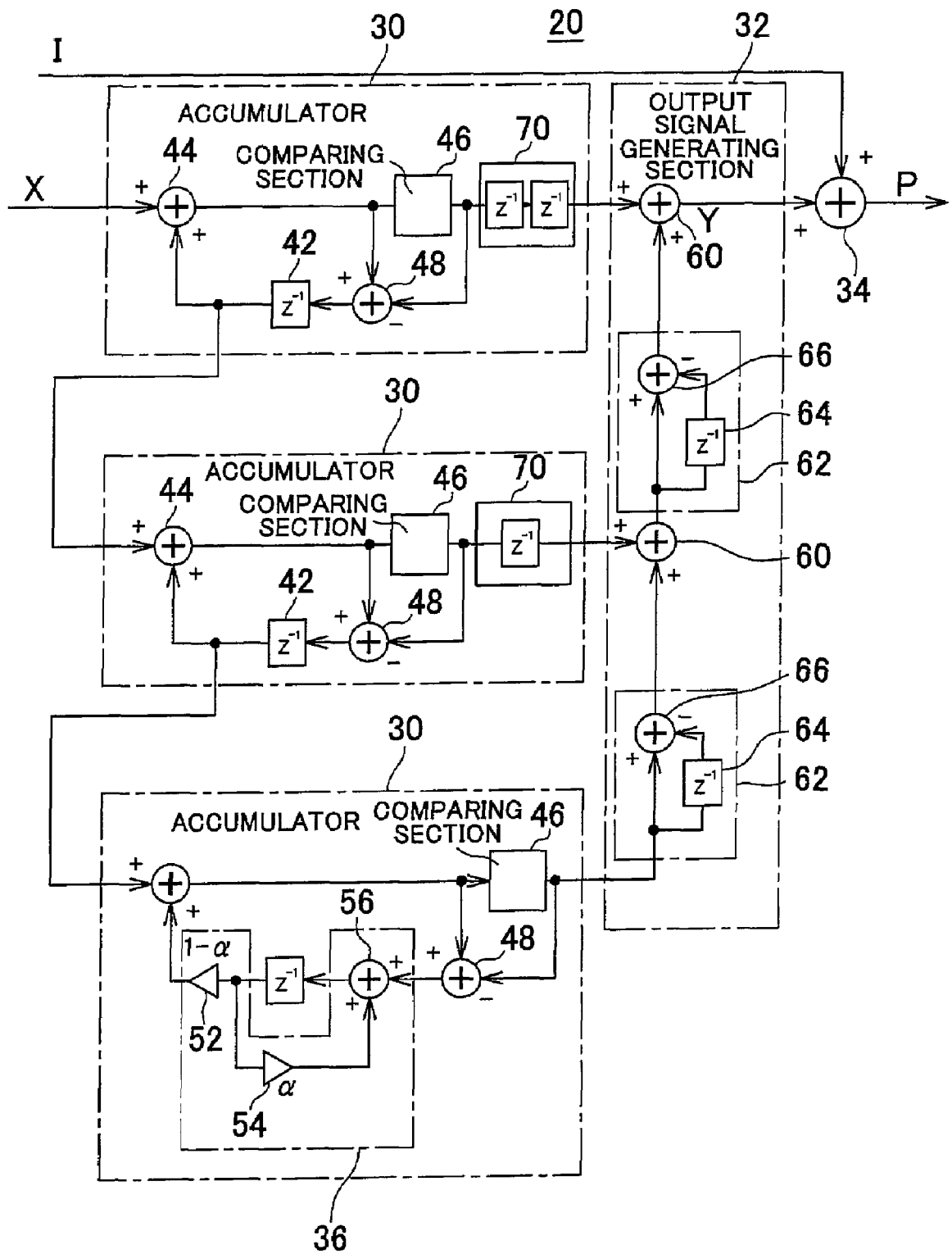
FIG. 13 shows a configuration of a sigma delta modulator 20 according to an alternative example of the present embodiment.

FIG. 13 shows a configuration of a sigma delta modulator 20 according to an alternative example of the present embodiment. In addition, since the components of the sigma delta modulator 20 according to the present alternative example have the same configuration and function as those of FIG. 2, their descriptions will be omitted except the differences.

In the present alternative example, an integration value output from the accumulation register 42 in the preceding-stage accumulator 30 is input into the addition section 44 in the other accumulator 30 other than the first-stage accumulator. In other words, each of the other accumulators 30 other than the first-stage accumulator receives the corresponding integration value at the time delayed by one clock from the time at which a signal is input into the preceding-stage accumulator 30. Moreover, each of the accumulators 30 other than the final-stage accumulator further includes a delaying section 70. Each of the delaying sections 70 delays a comparison result signal output from the comparing section 46 and outputs the delayed signal to the next output signal generating section 32.

Here, the delaying section 70 included in each of the accumulators 30 other than the final-stage accumulator subtracts the comparison result signal by the number of clocks which is obtained by subtracting the stage number of the corresponding accumulator 30 from the number of the plurality of accumulators 30 included in the sigma delta modulator. 20. As an example, in case that the sigma delta modulator 20 has the three accumulators 30, the delaying section 70 included in the first-stage accumulator 30 delays the comparison result signal by two clocks (=3−1 clocks) and the delaying section 70 included in the second-stage accumulator 30 delays the comparison result signal by one clock (=3−2 clock). According to this, each of the plurality of accumulators 30 can output the comparison result signal to the output signal generating section 32 in synchronization with the timing of the other accumulator 30.

The sigma delta modulator 20 as described above can also obtain an effect similar to that of the circuit shown in FIG. 2. Therefore, the fractional frequency synthesizer 10 including the sigma delta modulator 20 in FIG. 13 can increase an inclination of noise shaping and reduce a phase noise in the vicinity of a frequency of an oscillation signal.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A sigma delta modulator that outputs an output signal obtained by performing sigma delta modulation on an input signal, comprising:
   a plurality of accumulators that are serially connected to one another; and
   an output signal generating section that generates the output signal based on comparison result signals respectively output from the accumulators,
   wherein
      each of the accumulators integrates values of signals being input and when an integration value is not less than a reference value, outputs the comparison result signal with a predetermined value and subtracts the value of the comparison result signal from the integration value,
      the value of the input signal is at least input into the accumulator connected to a predetermined stage,
      the integration value of one of the accumulators is input into the following accumulator, and
      at least one of the accumulators includes a low-pass IIR filter that removes a predetermined frequency component higher than a predetermined frequency in a waveform of the integration value,
      each of the accumulators comprises:
         an accumulation register;
         an addition section that adds a value according to a value stored on the accumulation register to the value of the input signal and outputs the integration value;
         a comparing section that compares the integration value and the reference value and outputs, when the integration value is not less than the reference value, the comparison result signal with the predetermined value; and
         a subtraction section that subtracts the value of the comparison result signal output from the comparing section from the integration value input into the comparing section and stores its result on the accumulation register, and
      the low-pass filter comprises:
         a first multiplication section that multiplies a first coefficient by the value stored on the accumulation register and inputs its result into the addition section;
         a second multiplication section that multiplies a second coefficient by the value stored on the accumulation register and outputs its result; and
         an in-filter addition section that adds the value output from the second multiplication section to the value output from the subtraction section and stores its result on the accumulation register.

2. The sigma delta modulator as claimed in claim 1, wherein the accumulator connected to the predetermined stage is the accumulator connected to a first stage.

3. The sigma delta modulator as claimed in claim 1, wherein the accumulator of a final stage has the low-pass filter and the other accumulators do not have the low-pass filter.

4. A fractional frequency synthesizer comprising:
   a voltage controlled oscillator that outputs an oscillation signal with a frequency according to a level of a given control voltage;
   a frequency divider that divides a frequency of the oscillation signal with a set division ratio;
   a sigma delta modulator that switches a division ratio in the frequency divider based on an input signal showing a decimal part of the division ratio to be set in the frequency divider; and
   a phase comparator that generates the control voltage with a level according to a phase difference between the oscillation signal divided by the frequency divider and a given reference signal,
   wherein
      the sigma delta modulator comprises:
         a plurality of accumulators that are serially connected to one another; and
         an output signal generating section that generates the output signal on the basis of comparison result signals respectively output from the accumulators,
      each of the accumulators integrates values of signals being input and when an integration value is not less than a reference value, outputs the comparison result signal with a predetermined value and subtracts the value of the comparison result signal from the integration value,
      the value of the input signal is at least input into the accumulator connected to a predetermined stage,
      the integration value of one of the accumulators is input into the following accumulator, and
      at least one of the accumulators includes a low-pass IIR filter that removes a predetermined frequency component higher than a predetermined frequency in a waveform of the integration value,
      each of the accumulators comprises:
         an accumulation register;
         an addition section that adds a value according to a value stored on the accumulation register to the value of the input signal and outputs the integration value;
         a comparing section that compares the integration value and the reference value and outputs, when the integration value is not less than the reference value, the comparison result signal with the predetermined value; and
         a subtraction section that subtracts the value of the comparison result signal output from the comparing section from the integration value input into the comparing section and stores its result on the accumulation register, and
      the low-pass filter comprises:
         a first multiplication section that multiplies a first coefficient by the value stored on the accumulation register and inputs its result into the addition section;
         a second multiplication section that multiplies a second coefficient by the value stored on the accumulation register and outputs its result; and
         an in-filter addition section that adds the value output from the second multiplication section to the value output from the subtraction section and stores its result on the accumulation register.

5. The fractional frequency synthesizer as claimed in claim 4 wherein the accumulator connected to the predetermined stage is the accumulator connected to a first stage.

6. A sigma delta modulating method for outputting an output signal obtained by performing sigma delta modulation on an input signal, the method comprising:
   a plurality of accumulation output steps of integrating values of signals being input and when an integration value is not less than a reference value, outputting a comparison result signal with a predetermined value and subtracting a value of the comparison result signal from the integration value; and an output signal generating step of generating the output signal on the basis of each of the comparison result signals, wherein
one of the plurality of accumulation output steps includes a step of integrating the integration value in the preceding accumulation output step as the value of the input signal and, with the exception of a final accumulation output step, outputting this integration value to the following accumulation output step, and the plurality of accumulation output steps are sequentially executed, the value of the input signal is at least input into a predetermined step of the accumulation output steps, and at least one of the accumulation output steps includes a step of removing, by means of a low-pass IIR filter, a predetermined frequency component higher than a predetermined frequency in a waveform of the integration value, each of the accumulation output steps comprises:
adding a value according to a value stored on an accumulation register to the value of the input signal and outputting the integration value;

comparing the integration value and the reference value and outputting, when the integration value is not less than the reference value, the comparison result signal with the predetermined value; and subtracting the value of the comparison result signal from the integration and storing a subtraction result on the accumulation register, and the removing step comprises:
multiplying a first coefficient by the value stored on the accumulation register and inputting a first multiplication result for use in the adding step of the accumulation output step;

multiplying a second coefficient by the value stored on the accumulation register and outputting a second multiplication result; and adding the second multiplication result to the subtraction result and storing an adding result on the accumulation register.

7. The sigma delta modulating method as claimed in claim 6, wherein the input signal is input into a first accumulation output step of the plurality of accumulation output steps that are sequentially executed.

* * * * *